(12) United States Patent
Komatsu et al.

(10) Patent No.: US 7,868,308 B2
(45) Date of Patent: Jan. 11, 2011

(54) ELECTRON BEAM WRITING METHOD, FINE PATTERN WRITING SYSTEM, AND MANUFACTURING METHOD OF UNEVEN PATTERN CARRYING SUBSTRATE

(75) Inventors: Kazunori Komatsu, Odawara (JP); Toshinori Usa, Odawara (JP)

(73) Assignee: Fujifilm Corporation, Tokyo (JP)

( * ) Notice: Subject to any disclaimer, the term of this patent is extended or adjusted under 35 U.S.C. 154(b) by 195 days.

(21) Appl. No.: 12/359,418

(22) Filed: Jan. 26, 2009

(65) Prior Publication Data
US 2009/0189094 A1 Jul. 30, 2009

(30) Foreign Application Priority Data
Jan. 24, 2008 (JP) .............................. 2008-013532

(51) Int. Cl.
G21K 5/10 (2006.01)
H01J 37/08 (2006.01)
(52) U.S. Cl. .............................. 250/492.22; 250/396 R; 250/492.3; 369/101; 430/296; 430/842; 360/135
(58) Field of Classification Search ............ 250/492.22, 250/396 R, 492.3; 850/3; 430/296, 842; 360/135; 369/101
See application file for complete search history.

(56) References Cited

U.S. PATENT DOCUMENTS

| | | | |
|---|---|---|---|
| 7,026,098 B2 | 4/2006 | Komatsu et al. | |
| 2009/0140162 A1* | 6/2009 | Komatsu et al. | 250/396 R |
| 2009/0140163 A1* | 6/2009 | Komatsu et al. | 250/396 R |
| 2009/0184265 A1* | 7/2009 | Komatsu et al. | 250/492.22 |
| 2009/0194711 A1* | 8/2009 | Usa et al. | 250/492.3 |
| 2009/0230328 A1* | 9/2009 | Komatsu et al. | 250/492.3 |
| 2009/0242788 A1* | 10/2009 | Komatsu et al. | 250/396 R |
| 2010/0237262 A1* | 9/2010 | Usa et al. | 250/492.3 |

FOREIGN PATENT DOCUMENTS

JP  2006-184924  7/2006

* cited by examiner

*Primary Examiner*—Robert Kim
*Assistant Examiner*—Meenakshi S Sahu
(74) *Attorney, Agent, or Firm*—Young & Thompson

(57) ABSTRACT

A fine pattern which includes servo patterns, each constituted by servo elements, and groove patterns, each for separating adjacent data tracks, is formed on a substrate applied with a resist and placed on a rotation stage by scanning an electron beam on the substrate. While rotating the substrate in one direction, the electron beam is scanned so as to completely fill servo elements corresponding to a plurality of tracks one by one during one rotation of the substrate by X-Y deflecting the electron beam and vibrating back and forth in the radius direction. Each groove pattern is set as a line-up of a plurality of groove elements divided at a predetermined angle, and groove elements corresponding to the plurality of tracks following the writing of the servo elements are sequentially written by deflection scanning the electron beam largely in a circumferential direction during the same rotation.

6 Claims, 4 Drawing Sheets

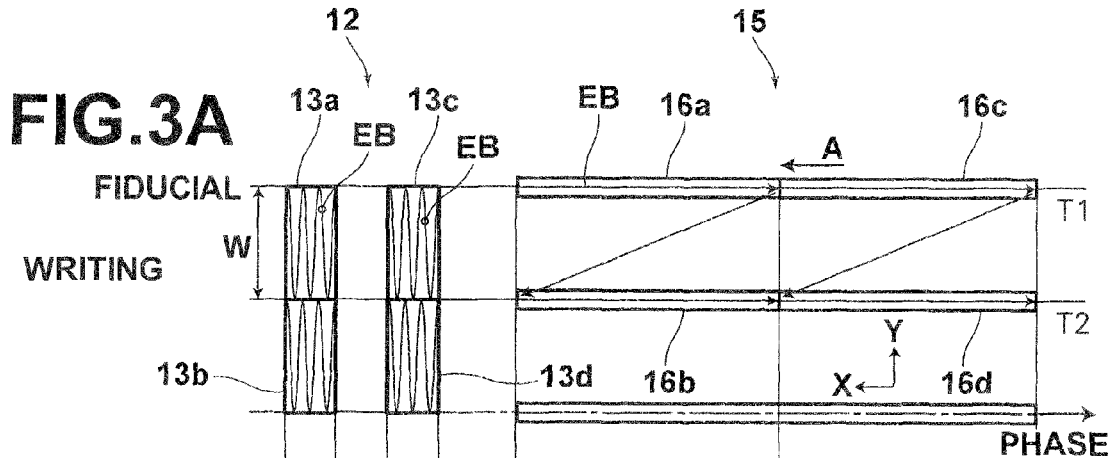

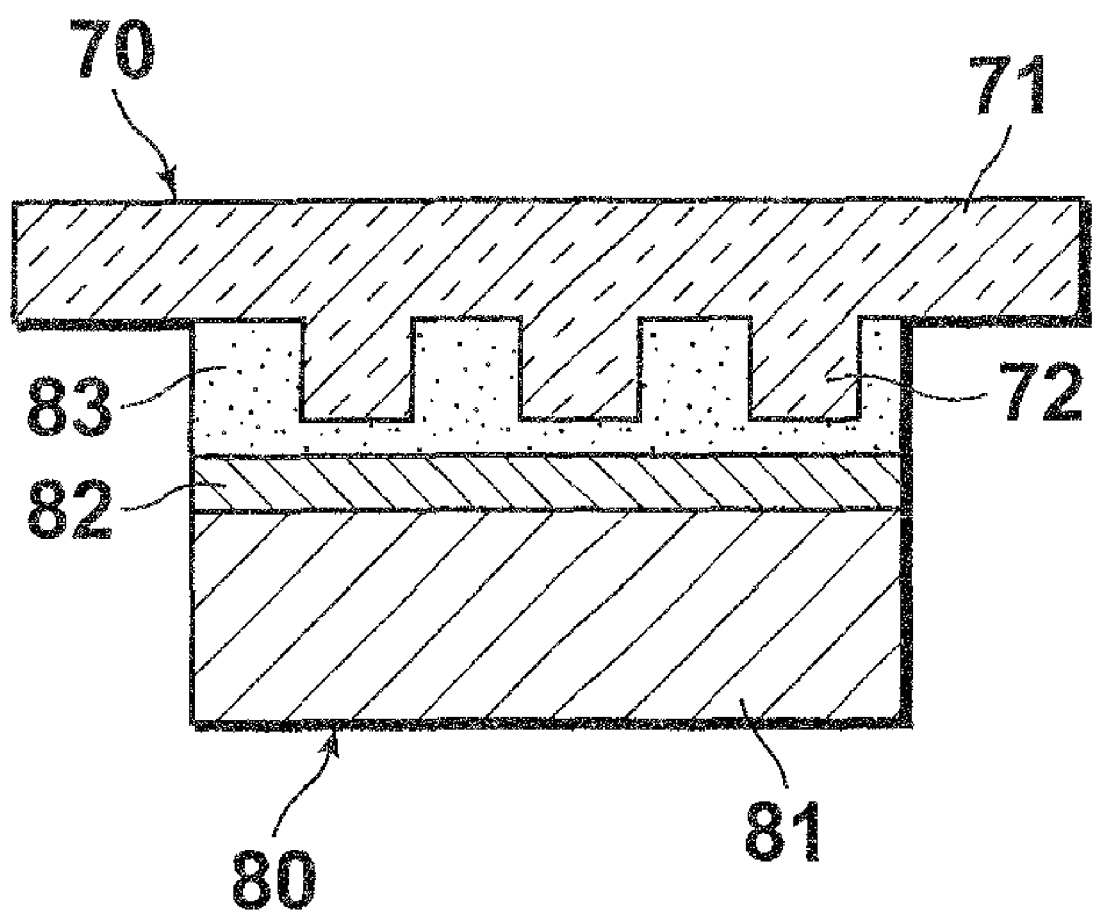

ELECTRON BEAM WRITING METHOD, FINE PATTERN WRITING SYSTEM, AND MANUFACTURING METHOD OF UNEVEN PATTERN CARRYING SUBSTRATE

BACKGROUND OF THE INVENTION

1. Field of the Invention

The present invention relates to an electron beam writing method for writing a fine pattern (uneven pattern) on a resist provided on a substrate by irradiating an electron beam on the resist when manufacturing a discrete track medium, and a fine pattern writing system for implementing the electron beam writing method.

The invention also relates to a manufacturing method of an uneven pattern carrying substrate that includes an imprint mold having an uneven pattern surface formed through a writing step using the electron beam writing method described above.

2. Description of the Related Art

Fine patterns, such as servo patterns and the like, are formed on magnetic disk media. As one of the methods of forming such fine patterns, an electron beam writing method in which patter writing is performed by irradiating an electron beam on a substrate applied with a resist according to the shape of a pattern while rotating the substrate is proposed as described, for example, in U.S. Pat. No. 7,026,098 and Japanese Unexamined Patent Publication No. 2006-184924.

The electron beam writing method described in U.S. Pat. No. 7,026,098 is a method in which when writing, for example, a rectangular or parallelogram element, which constitute a servo pattern, extending in a track width direction, the electron beam is deflected in a radius direction while vibrating rapidly in circumferential directions to scan the beam so as to completely fill the area of the element.

The electron beam writing method described in Japanese Unexamined Patent Publication No. 2006-184924 is a method in which, when writing an element of a record bit string having the same length in a track width direction and different lengths in a track direction, the writing is performed by rapidly vibrating an electron beam in a radius direction of a substrate while controlling the amplitude thereof as the substrate is rotated.

Further, as on/off writing method, a method in which pattern writing is performed by on/off irradiating an electron beam on a substrate applied with a resist according to the shape of a pattern while rotating the substrate, and shifting the substrate or electron beam irradiation unit by one beam width every rotation of the substrate in a radius direction is also known.

Recently, in view of the demand of higher recording density, a discrete track medium (DTM), in which magnetic interference between adjacent data tracks is reduced by separating the tracks with a groove pattern (guard band), has been attracting wide attention.

When writing a fine pattern on such a discrete track medium, the aforementioned electron beam writing methods pose a problem that the methods require a long time to write the fine pattern on the entire surface of the substrate because of a narrower track width and an increased number of tracks to be written due to the formation of groove patterns.

For example, according to the writing method described in U.S. Pat. No. 7,026,098, it is difficult to effectively improve the writing time for the increased number of tracks, although the writing time may be reduced for servo patterns by the employment of the back and forth vibration scheme in comparison with the on/off writing method. In particular, the method has difficulties in accurately writing a groove pattern with a predetermined width, in addition to the problem of having difficulties in reducing the writing time.

That is, according to the writing method described in U.S. Pat. No. 7,026,098, a servo pattern may be written on a discrete track medium with the predetermined characteristics described therein, but when writing a groove pattern on the medium following the servo pattern, if the electron beam is fixedly irradiated to write the groove pattern in an arc shape by the rotation of the substrate, the radiation dose of the electron beam becomes excessive for the groove pattern and the line width is increased by exposure bleeding, thereby posing a problem that a groove pattern having a predetermined width relative to the track width is not written. This is due to the fact that, for the writing of a servo pattern, electron beam intensity is set great to allow scan writing of a predetermined area with a predetermined exposure amount by rapidly vibrating the electron beam in a track direction while the substrate is rotated at a constant speed. It is difficult to reduce the beam intensity when transferring the writing from a servo pattern to a groove pattern from the viewpoint of operational stability of the electron beam radiation unit.

It is possible to secure the writing characteristics for a groove pattern by writing the groove pattern with a different rotation speed and different conditions from those for writing a servo pattern. But this writing method has a problem that the writing time is further extended since a fine pattern for one track is written with a plurality of different rotation speeds of the substrate.

In the mean time, in the writing method described in Japanese Unexamined Patent Publication No. 2006-184924, a groove pattern is written in a manner similar to that described in U.S. Pat. No. 7,026,098, thus the radiation dose becomes excessive in the same way. Therefore, the method also has the problem of having difficulties in writing a groove pattern with a desired width, in addition to the problem of extended time for writing a fine pattern for a discrete track medium on the entire surface of the substrate.

The on/off writing method described above is a suitable method for writing a groove pattern, but it requires a long time for writing servo patterns on the entire substrate, as well as having a problem that it is difficult to write a pattern having a predetermined shape by securing on/off positional accuracy of the electron beam during one rotation of the substrate and positional accuracy in inner and outer circumferences.

Further, if it is possible to write a portion of a fine pattern corresponding to a plurality of tracks during one rotation of the substrate, the time for writing the fine pattern on the entire surface of the substrate will be reduced. But it is difficult to write a portion of a fine pattern of discrete track medium corresponding to a plurality of tracks during one rotation of the substrate, since portions of servo patterns and groove patterns are present in a mixed manner in a single track.

In view of the circumstances described above, it is an object of the present invention to provide an electron beam writing method capable of writing portions of servo patterns and groove patterns in a fine pattern of a discrete track medium corresponding to a plurality of tracks during one rotation of the substrate with a uniform radiation dose, and a fine pattern writing system for implementing the electron beam writing method.

It is a further object of the present invention to provide a manufacturing method of an uneven pattern carrying substrate having a fine pattern accurately written by an electron beam, such as an imprint mold or the like.

SUMMARY OF THE INVENTION

An electron beam writing method of the present invention is a method for writing a fine pattern, to be formed on a discrete track medium, on a substrate applied with a resist and placed on a rotation stage by scanning an electron beam on the substrate while rotating the rotation stage, the fine pattern including servo patterns, each constituted by servo elements having a track direction length greater than an irradiation diameter of the electron beam, and groove patterns, each extending in the track direction to separate adjacent data tracks in a groove-like manner, wherein, while rotating the substrate in one direction, portions of the servo patterns and groove patterns corresponding to a plurality of tracks are written during one rotation of the substrate, wherein:

the portion of each servo pattern corresponding to the plurality of tracks is written by rapidly vibrating the electron beam back and forth in a radius direction of the rotation stage with an amplitude corresponding to one track width and at the same time deflecting and moving the electron beam in a direction opposite to a rotational direction of the rotation stage faster than a rotation speed of the rotation stage to scan the electron beam so as to completely fill the shape of one of servo elements in the portion as one unit of writing, and sequentially moving the writing start position of the electron beam to each of the other servo elements and sequentially repeating the one unit of writing; and groove patterns for the plurality of tracks following the writing of the portion of each servo pattern during the same rotation of the substrate are written by setting each of the groove patterns as a line-up of a plurality of groove elements divided at a predetermined angle, writing a first groove element for a first track by deflection scanning the electron beam in the direction opposite to the rotational direction of the rotation stage as the substrate is rotated, deflecting the electron beam in the same direction as the rotational direction and the radius direction to a next track, writing a first groove element of the next track by deflection scanning the electron beam in the direction opposite to the rotational direction, sequentially writing first groove elements for the other of the plurality of tracks, deflecting the electron beam to the direction opposite to the radius direction to return the electron beam to the first track, writing a next groove element for the first track in the same manner as above, and sequentially writing next groove elements for the other of the plurality of tracks in the same manner as above.

In the electron beam writing method described above, it is preferable that, in each of the servo patterns, when servo elements are arranged contiguously in a radius direction of a plurality of tracks, the servo elements be written by writing the servo element for a first track, moving the electron beam to the writing start position of the servo element of a next track by deflecting the electron beam in the same direction as the rotational direction and in the radius direction to the next track, and writing the servo element for the next track.

Further, in the electron beam writing method described above, the width of each groove element of each of the groove patterns be set by changing the deflection speed of the electron beam in the direction orthogonal to the radius direction.

A fine pattern writing system of the present invention is a system for realizing the electron beam writing method described above, and includes: a signal output unit for outputting a write data signal; and an electron beam writing unit for scanning an electron beam.

Preferably, the fine pattern writing system is structured in the following manner. That is, the electron beam writing unit includes a rotation stage movable in a radius direction thereof while rotating a substrate applied with a resist, an electron gun that emits an electron beam, a deflection means that X-Y deflects the electron beam in a radius direction of the substrate and a direction orthogonal to the radius direction and rapidly vibrates the electron beam in the radius direction, a blanking means that blocks the radiation of the electron beam other than a writing area, and a controller that performs associated operation control of each of the means. The signal output unit is configured to output a write data signal to the controller of the electron beam writing unit based on data corresponding to the form of a fine pattern to be written on the substrate.

A manufacturing method of uneven pattern carrying substrate of the present invention is a manufacturing method, including the steps of: exposure writing a fine pattern, to be formed on a discrete track medium, on a substrate applied with a resist by the electron beam writing method described above; and forming an uneven pattern corresponding to the fine pattern on the substrate. Here, the uneven pattern carrying substrate is a substrate having a desired uneven pattern shape on a surface thereof, such as an imprint mold for transferring the uneven pattern shape to a target medium or the like.

The term "imprint mold" as used herein refers to an original mold (also referred to as "stamper") having a fine uneven pattern formed thereon by electron beam writing like that described above. In a shape patterning method using imprint technology, a predetermined shape may be transferred to the surface of the medium at a time by pressing the imprint mold having the predetermined shape pattern onto the surface of a resin layer serving as a mask in the process of forming a magnetic disk medium.

According to the electron beam writing method of the present invention, writing of a fine pattern, to be formed on a discrete track medium, that includes servo patterns, each being constituted by servo elements having a track direction length greater than an irradiation diameter of the electron beam, and groove patterns, each extending in the track direction to separate adjacent data tracks in a groove-like manner, is performed in the following way. While rotating the substrate in one direction, portions of the servo patterns and groove patterns corresponding to a plurality of tracks are written during one rotation of the substrate. The portion of each servo pattern corresponding to the plurality of tracks is written by rapidly vibrating the electron beam back and forth in a radius direction of the rotation stage with an amplitude corresponding to one track width and at the same time deflecting and moving the electron beam in a direction opposite to a rotational direction of the rotation stage faster than a rotation speed of the rotation stage to scan the electron beam so as to completely fill the shape of one of servo elements in the portion as one unit of writing, and sequentially moving the writing start position of the electron beam to each of the other servo elements and sequentially repeating the one unit of writing. Groove patterns corresponding to the plurality of tracks following the writing of the portion of each servo pattern during the same rotation of the substrate are written by setting each of the groove patterns as a line-up of a plurality of groove elements divided at a predetermined angle, writing a first groove element for a first track by deflection scanning the electron beam in the direction opposite to the rotational direction of the rotation stage as the substrate is rotated, deflecting the electron beam in the same direction as the rotational direction and the radius direction to a next track, writing a first groove element of the next track by deflection scanning the electron beam in the direction opposite to the rotational direction, sequentially writing first groove elements for the other of the plurality of tracks, deflecting the electron beam to the direction opposite to the radius direction to return the electron beam to the first track, writing a next groove element for the first track in the same manner as above, and sequentially writing next groove elements for the other of the plurality of tracks in the same manner as above. This allows portions of the servo patterns and groove patterns corresponding to a plurality of tracks to be written during one rotation of the substrate with a uniform radiation dose, and a fine pattern, to be formed on a discrete track medium, which includes servo patterns and groove patterns may be written on the entire surface of the substrate rapidly and accurately, whereby the writing efficiency is improved and hence the writing time is reduced.

In particular, the scheme of repeating the writing of each servo element of the servo patterns by rapidly vibrating the electron beam back and forth in a radius direction of the rotation stage with an amplitude corresponding to one track width and at the same time deflecting and moving the electron beam in a direction opposite to a rotational direction of the rotation stage faster than a rotation speed of the rotation stage to scan the electron beam so as to completely fill the shape of one of servo elements as one unit of writing while shift deflecting the electron beam between the tracks allows writing with the same deflection control after moving the electron beam to the next writing start position, whereby the servo patterns corresponding to a plurality of tracks may be written rapidly and accurately.

Further, the scheme of writing each groove element of the groove pattern by deflection scanning the electron beam in a direction opposite to a rotational direction of the substrate while rotating the substrate in one direction allows writing of groove patterns corresponding to a plurality of tracks, and each groove element may be written at a predetermined width without undue radiation dose.

Where servo elements in each of the servo patterns arranged contiguously in a radius direction of a plurality of tracks are written by writing the servo element for a first track, moving the electron beam to the writing start position of the servo element of a next track by deflecting the electron beam in the same direction as the rotational direction and in the radius direction to the next track, and writing the servo element for the next track, portions of the servo patterns corresponding to the plurality of tracks may be written rapidly and accurately during one rotation of the substrate.

Further, in the electron beam writing method described above, where the width of each groove element of each of the groove patterns is set by changing the deflection speed of the electron beam in a direction orthogonal to the radius direction, the groove pattern may be written rapidly with an appropriate radiation dose.

The fine pattern writing system of the present invention includes, for realizing the electron beam writing method described above, a signal output unit for outputting an image data signal and an electron beam writing unit for scanning an electron beam, so that a fine pattern to be formed on a discrete track medium may be written rapidly and accurately, whereby the writing efficiency is improved and hence the writing time is reduced.

In particular, where the electron beam writing unit includes a rotation stage movable in a radius direction thereof while rotating a substrate applied with a resist, an electron gun that emits an electron beam, a deflection means that X-Y deflects the electron beam in a radius direction of the substrate and a direction orthogonal to the radius direction and rapidly vibrates the electron beam in the radius direction, a blanking means that blocks the radiation of the electron beam other than a writing area, and a controller that performs associated operation control of each of the means, and the signal output unit is configure to output a write data signal to the controller of the electron beam writing unit based on data corresponding to the form of a fine pattern to be written on the substrate, a preferable electron beam writing system may be obtained.

Further, according to the manufacturing method of an uneven pattern carrying substrate of the present invention, a fine pattern, to be formed on a discrete track medium, is exposure written on a substrate applied with a resist by the electron beam writing method described above and an uneven pattern corresponding to the fine pattern is formed on the substrate, so that a substrate having a highly accurate uneven pattern thereon may be obtained easily. In particular, in the case of an imprint mold, it has a fine pattern to be formed on a discrete track medium thereon. Therefore, when performing shape patterning using imprint technology, the fine pattern may be transferred to the surface of the medium at a time by pressing the imprint mold onto the surface of a resin layer serving as a mask in the process of forming a magnetic disk medium, whereby a discrete track medium with excellent characteristics may be produced easily.

BRIEF DESCRIPTION OF THE DRAWINGS

FIG. 3A is an enlarged schematic view of a basic writing principle for writing elements constituting the fine pattern.

FIGS. 3B to 3F illustrate various control signals, including a deflection signal and the like, used in the writing principle.

FIG. 5 is a schematic cross-sectional view, illustrating a process of transfer forming a fine pattern using an imprint mold having a fine pattern written by the electron beam writing method or fine pattern writing system.

DESCRIPTION OF THE PREFERRED EMBODIMENTS

Figure 1:
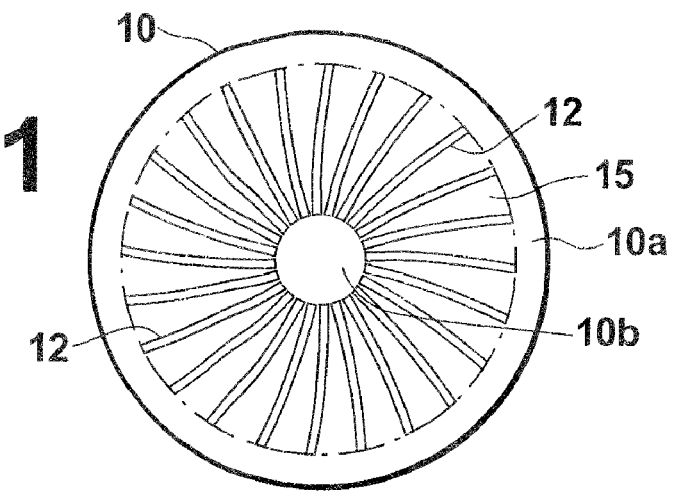
FIG. 1 is an overall plan view of a fine pattern of a discrete track medium to be written on a substrate by an electron beam writing method of the present invention.
Figure 2:
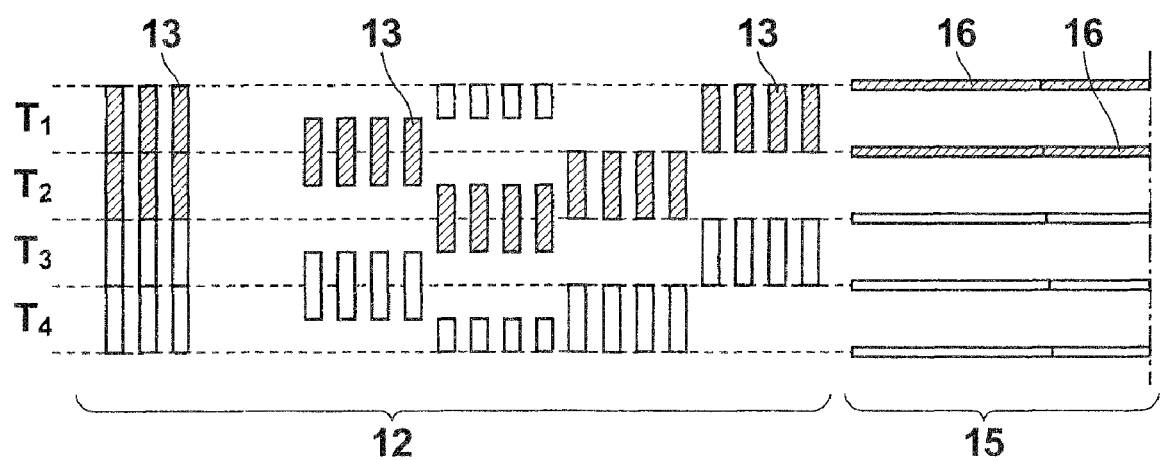
FIG. 2 is a partially enlarged view of the fine pattern.
Figure 4A:
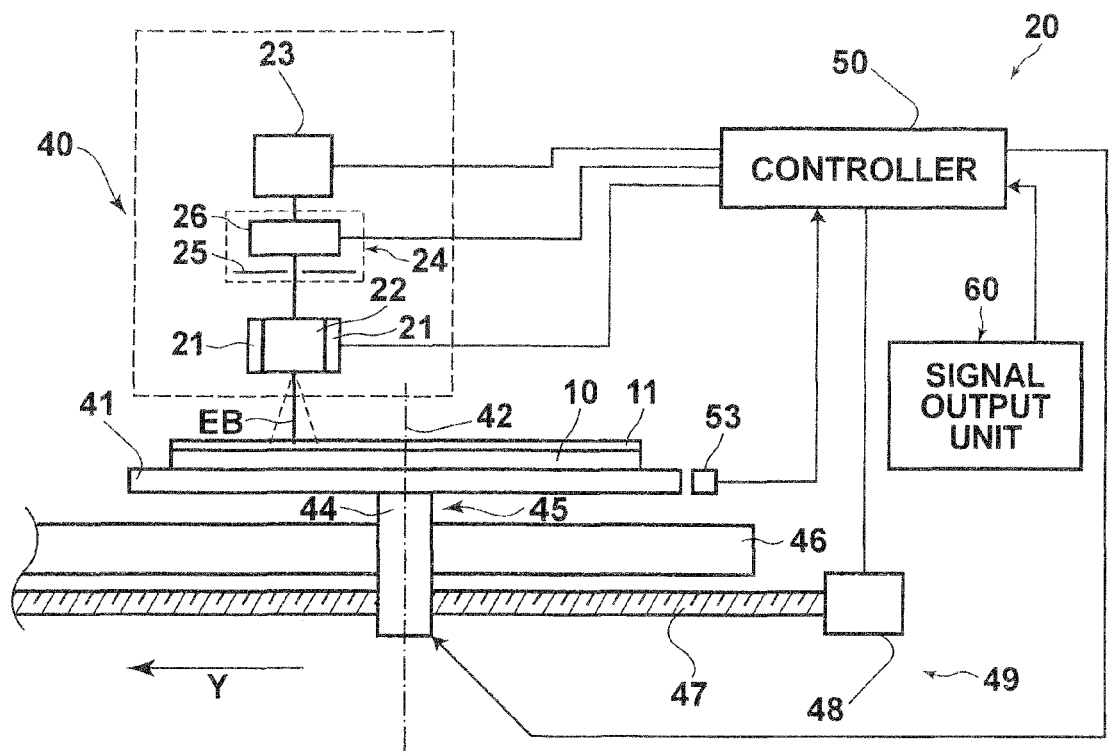
FIG. 4A is a relevant side view of a fine pattern writing system according to an embodiment of the present invention for implementing the electron beam writing method of the present invention.
Figure 4B:
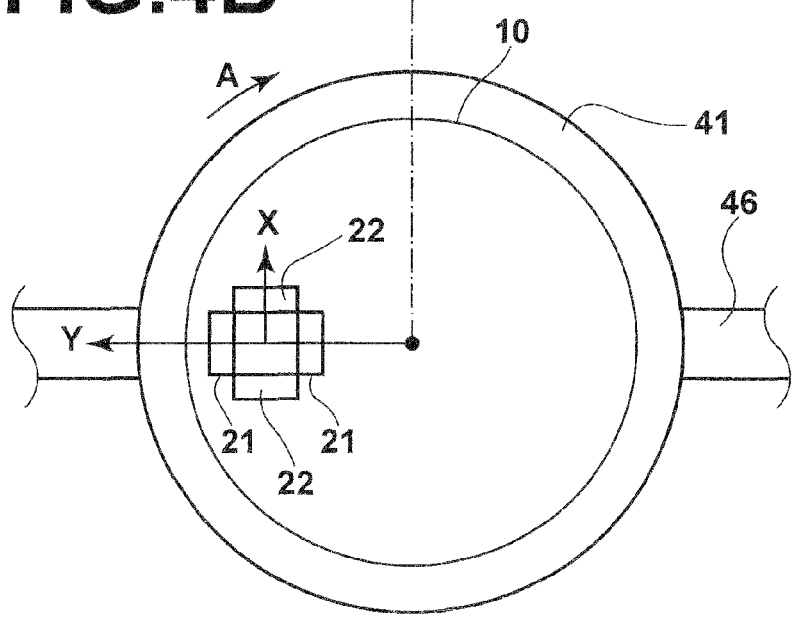
FIG. 4B is a partial plan view of the fine pattern writing system shown in FIG. 4A.

Hereinafter, an exemplary embodiment of the present invention will be described in detail with reference to the accompanying drawings. FIG. 1 is an overall plan view of a fine pattern of a discrete track medium to be written on a substrate by an electron beam writing method of the present invention. FIG. 2 is a partially enlarged view of the fine pattern. FIG. 3A is an enlarged schematic view of a basic writing principle for writing elements constituting the fine pattern. FIGS. 3B to 3F illustrate various control signals, including a deflection signal and the like, used in the writing principle. FIG. 4A is a relevant side view of a fine pattern writing system according to an embodiment of the present invention for implementing the electron beam writing method of the present invention. FIG. 4B is a partial plan view of the fine pattern writing system shown in FIG. 4A.

As illustrated in FIGS. 1 and 2, a fine pattern of fine uneven shape for a discrete track medium includes servo patterns 12 formed in servo areas, and groove patterns 15 formed in data areas. The fine pattern is formed on an annular region of disk-shaped substrate 10 other than outer circumferential portion 10a and inner circumferential portion 10b.

Servo patterns 12 are formed in elongated areas substantially radially extending from the center to each sector on concentric tracks of substrate 10 at regular intervals. In this example, servo patterns 12 are formed in contiguous curved radials in a radius direction. As shown in FIG. 2, which is a partially enlarged view of a portion of a servo pattern, fine rectangular servo elements 13 corresponding to, for example, preamble, address, and burst signals are disposed on concentric tracks T1 to T4. One servo element 13 has a width corresponding to one track width and a track direction length greater than an irradiation diameter of the electron beam. Some of servo elements 13 of the burst signal are shifted by a half track width and extending over an adjacent track.

In the mean time, groove patterns 15 are concentrically formed in each guard band area between data tracks and extending in a track direction so as to separate between adjacent tracks T1 to T4 like a groove. Each groove pattern 15 is formed of a line-up of a plurality of groove elements 16 divided at a predetermined angle.

Each servo element 13 and groove element 16 of servo pattern 12 and groove pattern 15 are written by rotating substrate 10 applied with a resist 11 and placed on rotation stage 41 (FIG. 4), to be describe later, and sequentially scanning elements 13 and 16 with electron beam EB to expose resist 11 for a plurality of tracks at a time from a track on the inner circumferential side to a track on the outer circumferential side or vice versa.

That is, a portion of the fine pattern corresponding to a plurality of tracks is written during one rotation of substrate 10 in order to reduce the writing time, like hatched servo elements 13 and groove elements 16 on two tracks T1 and T2, which extend linearly when viewed microscopically, are written in a first rotation, and non-hatched servo elements 13 and groove elements 16 on two adjacent tracks T3 and T4 are written in the next rotation, as shown in FIG. 2.

Servo elements 13 shifted by a half track and extending over an adjacent track are written at a time by shifting the writing fiducial by a half track without dividing them into halves. As will be described later, it is possible to perform the writing for three or more tracks at a time depending on the deflectable range of electron beam EB in a radius direction.

FIG. 3A illustrates an embodiment of the electron beam writing method of the present invention. In the present embodiment, a portion of servo pattern 12 for two tracks T1 and T2 (servo elements 13a to 13d) is written first and then groove patterns 15 for the two tracks (groove elements 16a to 16d) are sequentially written at a time during one rotation of substrate 10 (rotation stage 41) by scanning electron beam EB.

That is, for a plurality of tracks, tracks T1 and T2, servo elements 13 for the plurality of tracks of servo pattern 12 located between the groove patterns 15 are sequentially written and then the groove patterns 15 for the plurality of tracks are written, and portions of servo patterns 12 and groove patterns 15 corresponding to the plurality of tracks are alternately written during one rotation of the substrate.

In the scanning described above, electron beam EB having a beam diameter smaller than a minimum track direction length of servo elements 13a to 13d is ON/OFF controlled by blanking means 24 (aperture 25 and blanking 26), to be described later, and at the same time X-Y deflected by deflection means 21 and 22 in radius direction Y and circumferential direction X orthogonal to the radius direction while being rapidly vibrated back and forth in the radius direction Y orthogonal to circumferential direction X at a constant amplitude (one track width W), whereby the exposure writing is performed.

More specifically, while substrate 10 (rotation stage 41) is rotated in one direction A, two pairs of servo elements 13a to 13d of servo pattern 12 on tracks T1 and T2 (with track width W) disposed continuously and parallel in radius direction Y, shown in FIG. 3A, are written one by one by scanning electron beam EB so as to completely fill the shape of each servo element as one unit of writing.

One servo element 13 is written by vibrating electron beam EB back and forth in radius direction Y with the amplitude of one track width W and deflecting in circumferential direction X faster than the rotation speed. This writing is sequentially repeated by scanning electron beam EB in N-shaped trajectory, in which electron beam EB is moved to the next track and deflected, as required, in circumferential direction X which is the same direction as the rotational direction A so as to be moved to the writing start position of each of servo elements 13a to 13d, whereby servo elements 13a to 13d for the two tracks are written during one rotation of substrate 10.

Following this, two pairs of groove elements 16a to 16d of groove patterns 15 adjacent to the inner and outer circumferences divided in a radius direction at a predetermined angle shown in FIG. 3A are written by scanning electron beam EB in Z-shaped trajectory, whereby groove elements 16a to 16d for the two tracks are likewise written during one rotation of substrate 10. When groove patterns 15 are written, the rapid back and forth vibrations of electron beam EB in radius direction Y in the writing of servo elements 13 is stopped.

In the writing of groove patterns 15, first groove element 16a of track T1 divided at a predetermined angle is written by deflecting electron beam EB largely in circumferential direction X which is opposite to rotational direction A by the element length from the writing start position, and second groove element 16c on the same track, track T1, is written in the same manner after a time interval for substrate 10 to rotate to the writing start position by largely deflecting electron beam EB in circumferential direction X which is opposite to rotational direction A from the writing start position. During the time period between the writing of groove elements 16a and 16c, first groove element 16b of track 2 is written.

At this time, electron beam EB is deflected in circumferential direction X which is the same direction as rotational direction A so as to be returned to the writing start position of the first groove element 16a, and at the same time deflected in radius direction Y to the next track, track T2, whereby electron beam EB is moved to the writing start position of the first groove element, element 16b, of track T2. Then, groove element 16b is written by largely deflecting electron beam EB in circumferential direction X which is opposite to rotational direction A in the same manner as described above.

Detailed description will be made with reference to FIGS. 3A to 3F. FIG. 3A illustrates a writing operation by electron beam EB on substrate 10 in radius direction Y (outer circumferential direction) and circumferential direction X (rotational direction). FIG. 3B illustrates deflection signal Def(Y) that deflects electron beam EB in radius direction Y, and FIG. 3c illustrates deflection signal Def(X) that deflects electron beam EB in circumferential direction X. FIG. 3D illustrates vibration signal Mod(Y) that vibrates electron beam EB in radius direction Y. FIG. 3E illustrates ON/OFF operations of blanking signal BLK. FIG. 3F illustrates synchronization characteristic by encoder pulses. It is noted that, the horizontal axis in FIG. 3A represents rotational phase, and horizontal axes in FIGS. 3B to 3D represent time.

First, at point "a", blanking signal BLK is turned ON to irradiate electron beam EB and start writing of servo element 13a. While being vibrated back and forth in radius direction Y by vibration signal Mod(Y) (FIG. 3D), electron beam EB is deflected by deflection signal Def(X) (FIG. 3C) so as to be moved in circumferential direction X which is opposite to rotational direction A faster than the rotational speed, whereby electron beam EB is scanned so as to completely fill rectangular servo element 13a.

Then, at point "b", blanking signal BLK is turned OFF to terminate the irradiation of electron beam EB. After point "b", the irradiation position of electron beam EB is deflected to the writing start position of servo element 13b of the next track, track T2. That is, electron beam EB is shift deflected in radius direction (–Y) by one track by deflection signal Def(Y) (FIG. 3B) and largely in circumferential direction X which is the same direction as rotational direction A, including displacement of radiation position thereof due to the rotation of substrate 10 in rotational direction A by defection signal Def(X) (FIG. 3C), thereby moving electron beam to the writing start position of groove element 13b. Then, at point "c" where electron beam EB is moved to the writing start position, blanking signal BLK is turned ON to irradiate electron beam EB, and writing of servo element 13b of track T2 is started. The writing of servo element 13b is performed by vibrating electron beam EB back and forth in radius direction Y and in circumferential direction X which is opposite to rotational direction A faster than the rotational speed in the same manner as described above, whereby electron beam EB is scanned so as to completely fill servo element 13b. Then, at point "d", blanking signal BLK is turned OFF to terminate the irradiation of electron beam EB and writing of servo element 13b. Thereafter, the deflections of electron beam EB in radius direction Y and circumferential direction X are returned to the fiducial position.

Next, when substrate further rotates and reaches point "e", the writing of the next servo element, servo element 13c, is started in the same manner as described above and servo element 13c is written in the same manner as described above based on the same deflection signals, which is then terminated at point "f". Thereafter, electron beam EB is moved to the writing start position of servo element 13d of the next track, track T2, and the writing of servo element 13d is started at point "g" and servo element 13d is written in the same manner as described above based on the same deflection signals, which is then terminated at point "h". Then, the deflections of electron beam EB in radius direction Y and circumferential direction X are returned to the fiducial position.

Following this, at point "i", blanking signal BLK is turned ON to irradiate electron beam EB and the writing of the first groove element on track T1, groove element 16a, is started. In this case, vibration signal Mod (Y) in FIG. 3D is turned OFF to stop the back and forth vibrations in radius direction Y. Electron beam EB is deflected by deflection signal Def (X) in FIG. 3C so as to be moved largely in circumferential direction –X which is opposite to rotational direction A, whereby groove element 16a having a predetermined length is written, and the writing is terminated at point "j". The writing length corresponds to the deflection amount in –X direction plus rotation amount of substrate 10 in rotational direction A. Here, it is noted that the deflection signal Def(Y) in radius direction Y in FIG. 3B is turned OFF so that groove element 16a is not written in arc but linearly. In a microscopic range, however, a strait line is not deviated largely from an arc.

After point "j", electron beam EB is deflected largely in circumferential direction X which is the same direction as rotational direction A, including displacement arising from the rotation of substrate 10, so as to be returned to the writing start position of groove element 16a. At the same time, electron beam EB is deflected by deflection signal Def(Y) in FIG. 3B so as to be moved by one track in radius direction (–Y), whereby electron beam EB is positioned at the writing start position of the first groove element, groove element 16b, on the next track, track T2. Then, at point "k", blanking signal BLK is turned ON to irradiate electron beam EB and the writing of groove element 16b is started. Electron beam is deflected by deflection signal Def(X) in FIG. 3C so as to be moved largely in circumferential direction (–X) which is opposite to rotational direction A, whereby groove element 16b having a predetermined length is written, and the writing is terminated at point "m". Thereafter, the deflections in circumferential direction X and radius direction –Y are returned to the fiducial position.

After point "j", the writing of groove element 16b on track T2 is started immediately following the termination of the writing of groove element 16a on track T1, but a predetermined time may be allocated between them.

Next, when substrate 10 is further rotated and reaches at point "n" which is the writing start position of groove element 16c on track T1, irradiation and deflection control of electron beam EB are performed at points "o", "p", and "q" in the same manner as in the writing of groove element 16a on track T1 and groove element 16b on track T2, whereby groove element 16c on track T1 and groove element 16d on track T2 are written in the same manner.

The length of groove elements 16a to 16d is determined according to the beam intensity of electron beam set to a value which is sufficient to expose servo elements 13a to 13d on resist 11 by the rapid vibration writing. That is, the writing width (real exposure width) tends to become wider than the radiation beam diameter according to the exposure time. Therefore, the deflection speed of electron beam EB is controlled so as to be scanned with a predetermined radiation dose which ensures a real element exposure width. For example, in order to reduce the element width, the deflection speed is increased and radiation dose per unit area is reduced. It is noted that it is difficult to change beam intensity in the middle of writing from the viewpoint of beam stability.

Further, when writing groove elements 16a and 16c, the writing start positions, i.e., point "i" and point "n" in FIG. 3E, are positioned accurately based on the encoder pulse signal in FIG. 3F to improve the accuracy of the writing end position of groove pattern 15 at the end point of the data area. More specifically, the positions of point "i" and point "n" are synchronized with the encoder pulse signal and determined at positions after predetermined time (design time) t1 and t2 from the immediately preceding encoder pulses S1 and S2 respectively.

After two tracks T1 and T2 are written during one rotation, the electron beam EB is moved to the next two tracks and writing is performed in the same manner as described above, whereby desired fine patterns 12 and 15 are written on the entire area of substrate 10. The track migration of electron beam EB is performed by linearly moving rotation stage 41, to be described later, in radius direction Y. The movement is performed every writing of two tracks or every writing of a plurality of tracks (e.g., 8 tracks) according to the deflectable range of electron beam in radius direction Y. That is, rotation stage 41 is moved after the writing of a plurality of tracks is performed predetermined number of times by deflecting electron beam EB.

Deflection signal Def(X) in circumferential direction X allows writing of any parallelogram element, as well as compensation for the displacement of writing position arising from the rotation of rotation stage 41.

Preferably, writing by electron beam EB is performed by controlling the rotation speed of rotation stage 41 so as to be slow in the writing for the outer circumferential side and fast for the inner circumferential side so that the same linear speed is ensured over the entire writing area of substrate 10 when writing position in the writing area of substrate 10 is moved in the radius direction, i.e., track migration is performed from the viewpoint of securing a uniform radiation dose and accuracy of writing position.

As described above, electron beam EB is scanned in order to write each element 13 of servo pattern 12 and each element 16 of groove pattern 15. For performing the scanning control of electron beam EB, a write data signal is sent from signal output unit 60 (FIG. 4) to controller 50 of electron beam writing unit 40, to be described later. The timing and phase of the output signal are controlled based on the encoder pulse signal generated according to the rotation of rotation stage 41 and a reference clock signal.

In the mean time, where the recording system of patterns 12 and 15 described above is a constant angular velocity (CAV) system, the writing lengths of elements 13 and 16 in a track direction are formed long on an outer circumferential side track and short on an inner circumferential side track according to the variation of the sector length between the inner and outer circumferential sides. In this case, when servo elements 13 are written, the rotational linear speed is maintained constant as described above to maintain the deflection speed in circumferential direction X constant between the inner and outer circumferential side tracks and the writing length is changed by controlling the amount of deflection. This allows the exposure of each element 13 to be performed uniform under the same stable condition in which the frequency of back and forth vibrations in the radius direction and intensity of electron beam EB are maintained constant.

In order to perform the writing described above, fine pattern writing system 20 shown in FIG. 4 is used. Fine pattern writing system 20 includes electron beam writing unit 40 and signal output unit 60. Electron beam writing unit 40 includes rotation stage unit 45 having rotation stage 41 that supports substrate 10 and spindle motor 44 having a motor axis aligned with central axis 42 of rotation stage 41; shaft 46 passing through a portion of rotation stage unit 45 and extending in radius direction Y of rotation stage 41; and linear moving means 49 that moves rotation stage unit 45 along shaft 46. Rod 47 with accurate threading and disposed parallel to shaft 46 is screwed to a portion of rotation stage unit 45. Rod 47 is rotatable in the forward and reverse directions by pulse motor 48, and linear moving means 49 of rotation stage unit 45 is formed by rod 47 and pulse motor 48. Further, encoder 53 that generates encoder pulses at regular intervals and at predetermined rotational phases by reading encoder slits is installed for detecting the rotation of rotation stage 41, and the encoder pulse signal is outputted to controller 50. Controller 50 further includes a clock means (not shown) therein that generates the reference clock signal used for the timing control.

Electron beam writing unit 40 further includes electron gun 23 that emits electron beam EB, deflection means 21, 22 that deflect electron beam EB in radius direction Y and circumferential direction X, as well as microscopically vibrating the beam back and forth in radius direction Y with a constant amplitude, and aperture 25 and blanking 26 (deflector) as blanking means 24 for turning the radiation of electron beam EB ON and OFF. Electron beam EB emitted from electron gun 23 is irradiated on substrate 10 through deflection means 21, 22, a not shown lens, and the like.

Aperture 25 of blanking means 24 has a through hole for passing electron beam EB in the center, and blanking 26 operates according to input of ON/OFF signals, in which it passes electron beam EB through the through hole of aperture 25 during ON-signal without deflecting the beam, while it blocks electron beam EB with aperture 25 by deflecting the beam so as not pass through the through hole during OFF-signal, so that electron beam EB is not irradiated. Then, while each element 13 or 16 is being written, ON-signal is inputted to irradiate electron beam EB, and OFF-signal is inputted during the transfer period from element 13 to element 16 to block electron beam EB so that exposure is not performed.

Drive control of spindle motor 44, that is, the rotational speed of rotation stage 41, driving of pulse motor 48, that is, the linear movement of linear moving means 49, modulation of electron beam EB, control of deflection means 21, 22, ON/OFF control of blanking 26 of blanking means 24, and the like are performed based on control signals outputted from controller 50 serving as the control means.

Signal output unit 60 stores therein write data of a fine pattern for a discrete track medium and outputs the write data signal to controller 50. Controller 50 performs the associated control described above based on the write data signal, and electron beam writing unit 40 writes servo patterns 12 and groove patterns 15 of the fine pattern on the entire surface of substrate 10.

Substrate 10 to be placed on rotation stage 41 is made of, for example, silicon, glass, or quartz and a positive or negative electron beam writing resist 11 is applied on a surface thereof in advance.

Preferably, the power and beam diameter of electron beam EB are controlled taking into account the shapes of the respective elements 13 and 16, and the sensitivity of electron beam writing resist 11.

FIG. 5 is a schematic cross-sectional view illustrating a fine pattern transfer forming process using imprint mold 70 (uneven pattern carrying substrate) having a fine pattern written by the electron beam writing method using fine pattern writing system 20.

Imprint mold 70 has fine uneven patter 72 on a surface thereof and is obtained in the following manner. That is, resist 11 is applied on a surface of substrate 71 made of a transparent material, and servo patterns 12 and groove patterns 15 for a discrete track medium are written thereon by the electron beam writing method described above. Thereafter, imprint mold 70 is produced through development process, etching process, and the like.

An example method for manufacturing magnetic disk medium 80 by imprint method using imprint mold 70 will be described. Magnetic disk medium 80 as a discrete track medium includes substrate 81 on which magnetic layer 82 is stacked and resist resin layer 83 for forming a mask layer is provided thereon. The uneven shape of fine uneven pattern 72 is transfer formed by pressing fine uneven pattern 72 of imprint mold 70 against resist resin layer 83 and solidifying resist resin layer 83 by ultraviolet radiation. Thereafter, magnetic layer 82 is etched based on the uneven shape of resist resin layer 83, whereby magnetic disk medium 80 of discrete track with the fine uneven pattern formed on magnetic layer 82 is produced.

What is claimed is:

1. An electron beam writing method for writing a fine pattern, to be formed on a discrete track medium, on a substrate applied with a resist and placed on a rotation stage by scanning an electron beam on the substrate while rotating the rotation stage, the fine pattern including servo patterns, each constituted by servo elements having a track direction length greater than an irradiation diameter of the electron beam, and groove patterns, each extending in the track direction to separate adjacent data tracks in a groove-like manner, wherein, while rotating the substrate in one direction, portions of the servo patterns and groove patterns corresponding to a plurality of tracks are written during one rotation of the substrate, wherein:

the portion of each servo pattern corresponding to the plurality of tracks is written by rapidly vibrating the electron beam back and forth in a radius direction of the rotation stage with an amplitude corresponding to one track width and at the same time deflecting and moving the electron beam in a direction opposite to a rotational direction of the rotation stage faster than a rotation speed of the rotation stage to scan the electron beam so as to completely fill the shape of one of servo elements in the portion as one unit of writing, and sequentially moving the writing start position of the electron beam to each of the other servo elements and sequentially repeating the one unit of writing; and groove patterns corresponding to the plurality of tracks following the writing of the portion of each servo pattern during the same rotation of the substrate are written by setting each of the groove patterns as a line-up of a plurality of groove elements divided at a predetermined angle, writing a first groove element for a first track by deflection scanning the electron beam in the direction opposite to the rotational direction of the rotation stage as the substrate is rotated, deflecting the electron beam in the same direction as the rotational direction and the radius direction to a next track, writing a first groove element of the next track by deflection scanning the electron beam in the direction opposite to the rotational direction, sequentially writing first groove elements for the other of the plurality of tracks, deflecting the electron beam to the direction opposite to the radius direction to return the electron beam to the first track, writing a next groove element for the first track in the same manner as above, and sequentially writing next groove elements for the other of the plurality of tracks in the same manner as above.

2. The electron beam writing method as claimed in claim 1, wherein, in each of the servo patterns, when servo elements are arranged contiguously in a radius direction of a plurality of tracks, the servo elements are written by writing the servo element for a first track, moving the electron beam to the writing start position of the servo element of a next track by deflecting the electron beam in the same direction as the rotational direction and in the radius direction to the next track, and writing the servo element for the next track.

3. The electron beam writing method as claimed in claim 1, wherein the width of each groove element of each of the groove patterns is set by changing the deflection speed of the electron beam in the direction orthogonal to the radius direction.

4. A fine pattern writing system for realizing the electron beam writing method as claimed in claim 1, comprising a signal output unit for outputting a write data signal and an electron beam writing unit for scanning an electron beam.

5. The fine pattern writing system as claimed in claim 4, wherein:

the electron beam writing unit includes a rotation stage movable in a radius direction thereof while rotating a substrate applied with a resist, an electron gun that emits an electron beam, a deflection means that X-Y deflects the electron beam in a radius direction of the substrate and a direction orthogonal to the radius direction and rapidly vibrates the electron beam in the radius direction, a blanking means that blocks the radiation of the electron beam other than a writing area, and a controller that performs associated operation control of each of the means, and the signal output unit outputs a write data signal to the controller of the electron beam writing unit based on data corresponding to the form of a fine pattern to be written on the substrate.

6. A manufacturing method of an uneven pattern carrying substrate, comprising the steps of:

exposure writing a fine pattern, to be formed on a discrete track medium, on a substrate applied with a resist by the electron beam writing method as claimed in claim 1; and forming an uneven pattern corresponding to the fine pattern on the substrate.

\* \* \* \* \*